United States Patent [19]

Pronto

[11] Patent Number: 4,477,135

[45] Date of Patent: Oct. 16, 1984

[54] RETAINER FOR PRINTED CIRCUIT BOARDS

[75] Inventor: Stephen R. Pronto, Streamwood, Ill.

[73] Assignee: Motorola, Inc., Schaumburg, Ill.

[21] Appl. No.: 450,572

[22] Filed: Dec. 16, 1982

[51] Int. Cl.³ .............................................. H01R 4/66
[52] U.S. Cl. .................................... 339/14 R; 211/41; 339/17 LC; 361/406
[58] Field of Search ........... 339/17 L, 17 M, 176 MP, 339/176, 17 LC, 17 LM, 14 R; 211/41; 361/406

[56] References Cited

U.S. PATENT DOCUMENTS

| | | | |
|---|---|---|---|
| 3,130,351 | 4/1964 | Giel | 339/17 L X |
| 3,186,554 | 6/1965 | Mack et al. | 211/41 |
| 3,216,580 | 11/1965 | Fricker | 211/41 |
| 3,644,868 | 2/1972 | Nevala | 339/17 |
| 3,829,741 | 8/1974 | Athey | 317/101 |
| 3,867,000 | 2/1975 | Michalak et al. | 339/17 |
| 3,932,016 | 1/1976 | Ammenheuser | 339/65 |
| 4,008,942 | 2/1977 | Grossi | 339/17 M X |
| 4,070,081 | 1/1978 | Takahashi | 339/91 |
| 4,198,024 | 4/1980 | Cavanna | 248/544 |

FOREIGN PATENT DOCUMENTS 0705704 12/1979 U.S.S.R. ..................... 339/176 MP

Primary Examiner—Eugene F. Desmond
Attorney, Agent, or Firm—Donald B. Southard; James W. Gillman; Edward R. Roney

[57] ABSTRACT

A unitary retainer is disclosed for mounting and holding a printed circuit board onto a support panel, another printed circuit board or the like. A retaining channel receives a forward portion of a board inserted thereinto at a corner of the board. The channel locates a side edge of the board and clamps opposite faces of the board. A lead-in guides the board into the channel. A locking portion holds the board in the retainer.

9 Claims, 3 Drawing Figures

U.S. Patent  Oct. 16, 1984  4,477,135
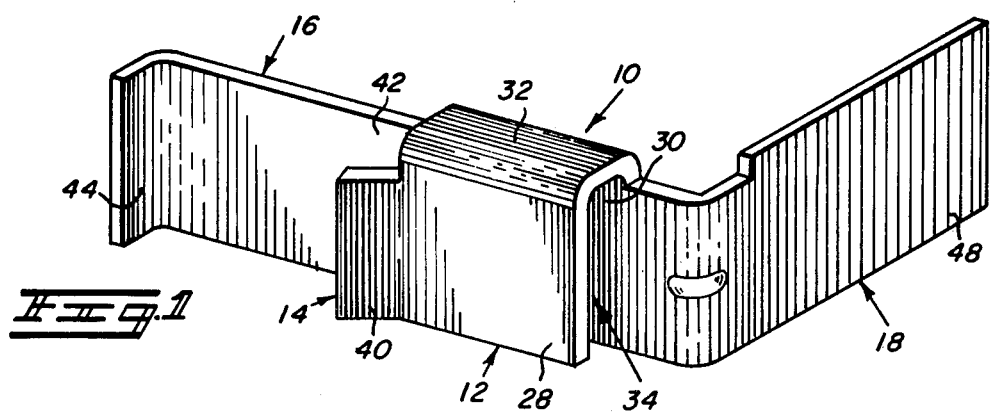
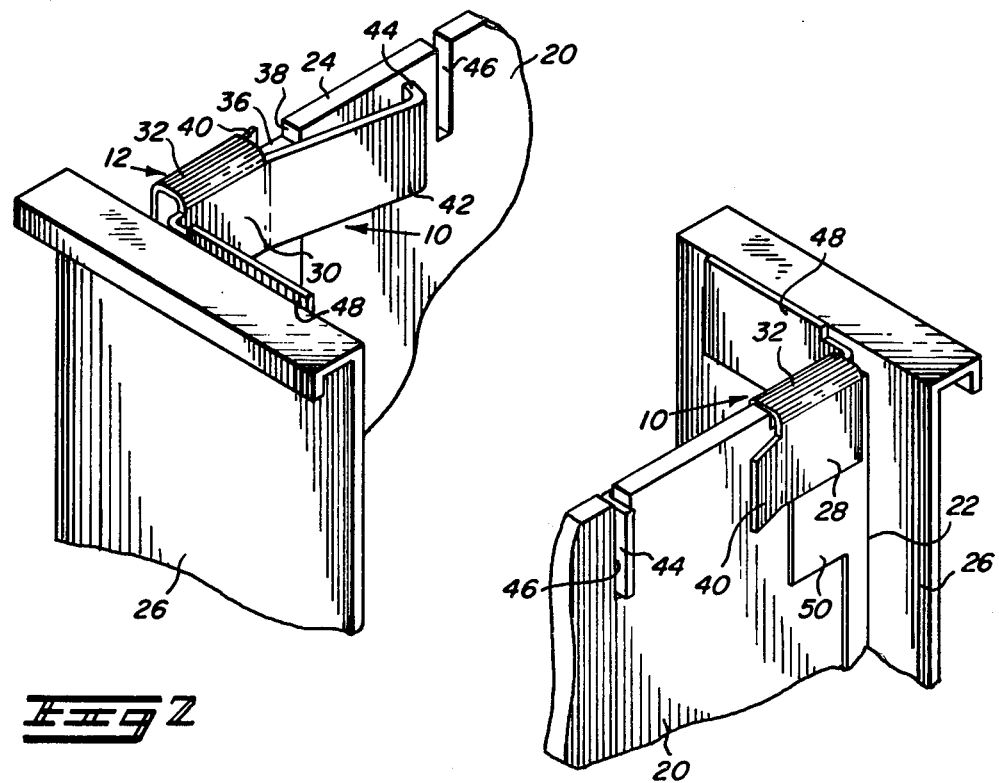

RETAINER FOR PRINTED CIRCUIT BOARDS

BACKGROUND OF THE INVENTION

This invention relates to a retainer for holding printed circuit boards or cards in their proper positions in an electrical system.

The use of printed circuit boards in the field of electronics has become widespread as a result of their convenience, flexibility, minimal space requirements and reduced production costs. The predominance of printed circuit boards is due in part to the ease and speed with which circuit board components are connected in an electrical system. In some instances the boards are press fitted directly into edge connectors which form part of the electronic circuitry. However, in many instances, printed circuit boards are required to be mounted on support panels, other printed circuit boards, or the like.

Oftentimes, these boards or cards tend to slip out of their mounts particularly if the system is jostled or bumped during handling and use, or if the boards themselves are relatively long so that they exert a considerable moment on their respective mounts or mounting brackets. In these eventualities the system's electrical characteristics may change so that it no longer operates properly. In some cases, a short circuit created by improper mounting of a printed circuit board may cause serious damage to other components in the system.

Some disadvantages of present mounts or mounting brackets for printed circuit boards revolve around the use of brackets which require hand tools to install or the bracket itself has separate mounting hardware. Many brackets do not properly align and/or lock the printed circuit boards in proper located assembly.

Consequently, there is a need for a new and improved, simple retainer or bracket for printed circuit boards or cards which requires no hand tools to install, requires no separate hardware, is self aligning and self locking, and is much faster in assembly to result in a substantial reduction of labor costs. The bracket or retainer must be reliable to prevent dislodgement of the boards during handling and use.

The present invention is directed to fulfilling the need and solving the problems described above by providing a new and improved retainer or bracket for mounting printed circuit boards in an electrical system.

SUMMARY OF THE INVENTION

An object, therefore, of the present invention is to provide a new and improved retainer or bracket for mounting a printed circuit board on a support panel, another printed circuit board, or the like.

Another object of the invention is to provide a printed circuit board retainer of the character described which is of a unitary structure and is simple to manufacture and use.

A further object of the present invention is to provide a printed circuit board retainer of the character described which requires no separate fastening hardware, requires no hand tools to install, is self aligning and self locking, and is much faster to assemble the printed circuit board in its electrical system.

In the exemplary embodiment of the invention, a unitary retainer is provided for holding a printed circuit board which includes a forward edge and an adjoining side edge at a corner of the board. Retaining means includes means for receiving a forward portion of the board adjacent the forward edge thereof on insertion of the board into the retainer, including means for locating the side edge of the board and for clamping opposite faces of the board. Lead-in means is provided for engaging the forward edge of the board during insertion thereof and guiding the board into the retaining means. Locking means is provided for engaging a complementary locking surface on the board to hold the board in located position in the retaining means after insertion of the board thereinto.

As disclosed herein, the retainer is fabricated as a one-piece component of ductile or flexible material such as sheet metal or the like. The unitary retainer includes a channel-shaped portion having two generally parallel legs joined by a bight portion. The legs define a channel for receiving a forward portion of the board along the forward edge thereof inserted into the channel in a direction generally parallel to the bight portion of the channel. The legs clamp opposite faces of the board at the corner thereof, with the bight portion engaging and locating the side edge of the board. An outwardly flared lip portion is disposed along one side edge of one of the channel legs generally perpendicular to the bight portion, providing means for engaging the forward edge of the board and guiding the board into the channel between the legs. A resilient extension portion of the other leg extends generally parallel to the bight portion away from the guiding lip. The resilient extension has locking means on the distal end thereof for engaging complementary locking means on the board to hold the board in located position within the channel.

The locking means on the distal end of the extension portion of the retainer comprises an inwardly directed flange for snapping engagement within a complementary slot in the printed circuit board.

The retainer also includes attaching means in the form of a unitary flange extending outwardly from and generally parallel to one of the channel legs for attachment to a support panel or another printed circuit board, as by welding.

It is contemplated that a pair of the retainers of the present invention, each having means for attachment to a support panel, may be provided for engaging and holding opposite corners of the printed circuit board to positively hold and lock the board against vertical, horizontal and fore and aft movement relative to its supporting structure.

It also is contemplated that a printed circuit board be provided with grounding means on at least one face thereof adjacent the corners thereof for engaging the unitary retainer of the present invention for grounding purposes.

Other objects, features and advantages of the present invention will be apparent from the following detailed description taken in connection with the accompanying drawings.

DESCRIPTION OF THE DRAWINGS

The features of this invention which are believed to be novel are set forth with particularity in the appended claims. The invention, together with its objects and the advantages thereof, may be best understood by reference to the following description taken in conjunction with accompanying drawings, in which like reference numerals identify like elements in the figures and in which:

FIG. 1 is a perspective view of the printed circuit board retainer or bracket of the present invention;

FIG. 2 is a perspective view of the rear of the retainer mounted on a support panel, with a printed circuit board being inserted into the retainer; and FIG. 3 is a front perspective view of the retainer mounted on a support panel, with the printed circuit board fully inserted into the retainer and locked therein.

DETAILED DESCRIPTION OF THE INVENTION

Referring to the drawings in greater detail, a retainer or bracket, generally designated 10, is disclosed for mounting and holding a printed circuit board on a support panel, another printed circuit board, or the like.

Generally, retainer 10 includes retaining means, generally designated 12, for receiving a forward portion of a printed circuit board adjacent a forward edge thereof on insertion of the board into the retainer. Retaining means 12 locates a side edge of the board and clamps opposite faces of the board. Lead-in means, generally designated 14, is provided for engaging the forward edge of the printed circuit board during insertion of the board and guiding the board into retaining means 12. Locking means, generally designated 16, is provided for engaging a complementary locking surface on the board to hold the board in located position in retaining means 12 after insertion of the board thereinto. Attaching means, generally designated 18, is provided for attaching retainer 10 to a support panel, another printed circuit board, or the like.

More particularly, and referring to FIGS. 2 and 3 conjunction with FIG. 1 described above, retainer 10 is designed for holding a printed circuit board 20, which includes a forward edge 22 and an adjoining side edge 24 at a corner of the board, to a support 26. Of course, the retainer may be employed for holding the board to another printed circuit board as well.

Retaining means 12 of retainer 10 comprises a channel-shaped portion having two generally parallel legs 28 and 30 joined by a bight portion 32. In the embodiment illustrated herein, leg 30 forms a continuation of locking means 16 and attaching means 18 as seen best in FIG. 1. Legs 28, 30 form a channel 34 (FIG. 1) for receiving a forward portion of printed circuit board 20 along the forward edge 22 (FIG. 3) thereof as the board is inserted into the channel generally parallel to bight portion 32. The retainer is unitarily fabricated of ductile or flexible material, such as metal or the like, whereby legs 28, 30 clamp opposite faces of the printed circuit board at a corner thereof, with bight portion 32 engaging and locating the side edge 24 of the board. In certain instances, the board may be cut-away, as at 36 in FIG. 2, to present a shoulder 38 for engaging the outer edge of bight portion 32. This further facilitates proper location of the board in the retainer.

Lead-in means 14 comprises an outwardly flared lip portion 40 along one side edge of leg 28 and extending generally perpendicular to bight portion 32. Lip 40 is provided for engaging the forward edge 22 of the printed circuit board and guiding the board into channel 34 between legs 28, 30. FIG. 2 shows board 20 being inserted into the channel after being guided thereinto by lip 40.

Locking means 16 comprises an extension portion 42 of leg 30 which extends generally parallel to and outwardly from bight portion 32. An inwardly directed flange 44 is provided on the distal end of extension portion 42 for snapping engagement within complementary locking surface means in the form of a slot 46 in printed circuit board 20. FIG. 2 shows extension portion 42 and flange 44 resiliently biased perpendicularly outwardly from retaining means 12 as the printed circuit board 20 is inserted into the retainer. Once the board is fully inserted as shown in FIG. 3, extension portion 42 snaps flange 44 into slot 46 of the printed circuit board to positively lock the board in retained position within the retainer.

Attaching means 18 comprises a unitary flange 48 bent generally at a right angle outwardly from leg 30 of retaining means 12. This flange is provided for attaching the retainer to support panel 26 or another printed circuit board, or the like. This can be done, for example by welding, but other means are likewise contemplated.

With the retainer of the present invention fabricated of metallic material, it can be readily used in combination with a printed circuit board which has a grounding path 50 (FIG. 3) on at least one face of the board. Since legs 28, 30 of the retainer clamp the board against any vibrations, the retainer itself provides a ground coupled to grounding path 50 of the printed circuit board.

Thus, it can be seen that the retainer or bracket of the present invention, which is a unitary or one-piece structure, provides means for mounting a printed circuit board to a support panel or the like without any extraneous hardware, hand tools or the like. The retainer self-aligns the printed circuit board by the lead-in lip 40 and clamps the board against vibrations by the clamping action of legs 28, 30. The board is positively locked within the retainer by resilient extension arm 42 which snaps locking flange 44 within slot 46 of the board. The board thus is locked against side vibrations as well as fore and aft movement. Further compensation against fore and aft movement can be provided by cutting a notch out of the side edge 24 of the board, as at 36 (FIG. 2), to provide a shoulder 38 abutting against bight portion 32 of the retainer. With horizontal and fore and aft movement of the board secured against by the retainer, it is contemplated that a second retainer as described herein be employed at the opposite corner of the printed circuit board, adjacent support panel 26, to completely lock the board in position, i.e. against vertical movement.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A retainer for holding a printed circuit board which includes a forward edge and an adjoining side edge at a corner of the board, comprising:

retaining means including a channel-shaped member having two leg portions and a bight portion, for receiving a forward portion of the board adjacent said forward edge on insertion of the board into the retainer, said bight portion for locating said side edge of the board and said leg portions for clamping opposite faces of the board;

lead-in means, comprising an outwardly flared lip extending along one side edge of one of said leg portions generally perpendicular to said bight portion, for engaging said forward edge of the board during insertion thereof and guiding the board into said retaining means; and locking means for engaging a complementary locking surface on the board to hold the board in located position in said retaining means after insertion of the board thereinto, said locking means comprising a resilient extension of the other of said leg portions extending generally parallel to said other bight portion.

2. The retainer of claim 1 wherein said locking means includes an inwardly directed flange portion on the end of said resilient extension for snapping engagement within complementary aperture means in said board.

3. A unitary retainer for holding a printed circuit board which includes a forward edge and an adjoining said edge at a corner of the board, comprising:
- a channel-shaped portion having two generally parallel legs joined by a bight portion, said legs defining a channel for receiving a forward portion of the board along said forward edge thereof inserted into the channel in a direction generally parallel to said bight portion, said legs clamping opposite faces of the board at said corner thereof with said bight portion engaging and locating said side edge of the board;
- an outwardly flared lip portion along one side edge of one of said legs generally perpendicular to said bight portion for engaging said forward edge of the board and guiding the board into said channel between said legs;
- a resilient extension portion of the other of said legs extending generally parallel to said bight portion away from said lip portion, said resilient extension portion having locking means on the board to hold the board in located position within said channel.

4. The unitary retainer of claim 3 wherein said locking means includes an inwardly directed flange portion on the end of said resilient extension for snapping engagement within complementary aperture means in said board.

5. The unitary retainer of claim 3, including means for attaching the retainer to a support panel, an-other printed circuit board, or the like.

6. The unitary retainer of claim 5 wherein said attaching means comprises a unitary flange extending outwardly from and generally parallel to one of said legs along a side edge thereof opposite said lip portion and extension portion.

7. The unitary retainer of claim 3, including a pair or said retainers each having means for attachment to a support panel, another printed circuit board, or the like, and for engaging and holding opposite corners of the board at opposite ends of said forward edge thereof.

8. The unitary retainer of claim 3 wherein said retainer is fabricated of resilient metallic material.

9. In combination with the retainer of claim 8, said printed circuit board including grounding means on at least one face thereof adjacent said corner thereof for engaging one of said metallic legs.

* * * * *